United States Patent [19]

McDonald et al.

[11] Patent Number: 6,022,595
[45] Date of Patent: Feb. 8, 2000

[54] INCREASE OF DEPOSITION RATE OF VAPOR DEPOSITED POLYMER BY ELECTRIC FIELD

[75] Inventors: John F. McDonald, Clifton Park; Toh-Ming Lu, Loudonville; Bin Wang; Guang Rong Yang, both of Troy, all of N.Y.

[73] Assignee: Rensselaer Polytechnic Institute, Troy, N.Y.

[21] Appl. No.: 08/792,044

[22] Filed: Jan. 31, 1997

Related U.S. Application Data

[60] Provisional application No. 60/010,962, Feb. 1, 1996.
[51] Int. Cl.$^7$ ....................................................... C08J 7/06
[52] U.S. Cl. ........................... 427/497; 427/509; 427/571
[58] Field of Search ..................................... 427/488, 490, 427/493, 497, 508, 509, 569, 571, 487; 118/723 R, 723 MA

[56] References Cited

U.S. PATENT DOCUMENTS

| | | | |
|---|---|---|---|
| 3,767,559 | 10/1973 | Agnone et al. | 204/192 |
| 4,013,532 | 3/1977 | Cormia et al. | 427/488 |
| 4,047,998 | 9/1977 | Yoshikawa et al. | 427/100 |
| 4,057,660 | 11/1977 | Yoshida et al. | 427/100 |
| 4,127,681 | 11/1978 | Ferren et al. | 427/123 |
| 4,673,588 | 6/1987 | Bringmann et al. | 118/723 E |
| 4,921,723 | 5/1990 | Nichols et al. | 427/495 |
| 5,212,118 | 5/1993 | Saxena . | |
| 5,262,208 | 11/1993 | Krapivina et al. | 427/488 |

Primary Examiner—Shrive Beck
Assistant Examiner—Bret Chen
Attorney, Agent, or Firm—Heslin & Rothenberg, P.C.

[57] ABSTRACT

A method of depositing a polymer film onto a semiconductor wafer is provided which includes the steps of connecting the wafer to one terminal of a voltage source, connecting an electrode to an other pole of the voltage source and placing the electrode and substrate in superposed orientation to form a parallel plate capacitor, wherein an electric field is produced between the electrode and substrate. The parallel plate capacitor is placed in a chamber where pressure andc temperature are maintained at predetermined levels and gaseous monomers of the desired film to be polymerized are introduced into the chamber. The gaseous monomers are then permitted to flow between the electrode and wafer while the voltage of the electric field is maintained at a level sufficient to polarize the monomers without breaking their chemical bonds wherein the polarized monomers react to form a polymer film on the wafer at an enhanced rate.

13 Claims, 6 Drawing Sheets

INCREASE OF DEPOSITION RATE OF VAPOR DEPOSITED POLYMER BY ELECTRIC FIELD

This application claims benefit of provisional application Ser. No. 60/010,962 filed Feb. 1, 1996.

BACKGROUND OF THE INVENTION

1. Technical Field

The present invention generally relates to vapor deposition of polymer films. More particularly, the present invention relates to increasing the rate of vapor deposition polymerization of such films by application of an electric field.

2. Background Information

Polymer films are commonly used to provide dielectric layers in fabrication of semiconductors. One material typically utilized for such a film is Parylene-N or PA-N, and may be applied to a semiconductor substrate or wafer using a conventional vapor deposition polymerization (VDP) technique. Powder di-p-xylylene (dimer) is typically used as the source material or precursor. The dimer molecules are vaporized and then decomposed into monomers by pyrolysis at a temperature of 650° C. The monomers are finally condensed and polymerized on the substrate such as a Silicon (Si) wafer at room temperature. The reaction process is schematically shown as:

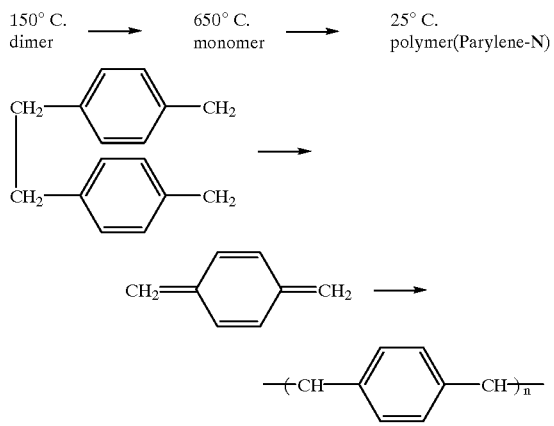

Generally, in order to get a quality polymer film by VDP, a relatively low deposition rate must be used. For example, under conventional conditions, the deposition rate to make quality PA-N films is 50–70 angstroms per minute at 50 milliTorr (mTorr). While the deposition rate may be increased by increasing deposition pressure, pressures generally cannot exceed approximately 80 mTorr without an attendant degradation in film quality, as manifested by a reduction in film clarity. A higher deposition rate tends to cause problems such as unpolymerized films, very short chain polymerization, opaque films mixed with dimer, soluble film, and very low molecular weight films.

However, slow deposition rate for VDP tends to have its own drawbacks. Such problems primarily entail relatively high manufacturing costs, but may also include lowered film quality due to a greater opportunity for reaction with oxygen and contamination by other impurities such as water vapor. Such contamination may affect the electric, thermal and optical properties of the resulting films.

A need thus exists for increasing the deposition rate of VDP without associated loss in film quality.

SUMMARY OF THE INVENTION

According to an embodiment of this invention, a polymer film is deposited onto a substrate by placing the substrate in a chamber and creating a field in the chamber which passes into the substrate. One or more vaporized reactants are then passed through the field. The field is maintained at a sufficient strength to polarize the reactant molecules without breaking the chemical bonds thereof such that the polarized molecules react to deposit a polymerized film of relatively high purity onto the substrate at an enhanced rate.

In a specific aspect of the invention, an electric field is utilized to enhance the rate of vapor deposition polymerization of a film onto a substrate such as a semiconductor wafer. The wafer is connected to a voltage source to form one of two electrodes of a parallel plate capacitor. The capacitor is placed in the chamber where parameters such as pressure and temperature are maintained at predetermined levels. Gaseous monomers of the desired film to be polymerized, such as Parylene, Teflon or Polynapthalene are supplied to the chamber and permitted to flow between the electrodes of the capacitor. The voltage of the electric field is maintained at a level sufficient to polarize the monomers without breaking their chemical bonds. The polarized monomers react to form a polymer film on the wafer at an enhanced rate.

The present invention therefore advantageously deposits the desired polymer film onto a substrate at a rate substantially greater than conventional, non-field enhanced vapor deposition polymerization.

The above and other objects and advantages of this invention will be more readily apparent from a reading of the following description of an exemplary embodiment thereof taken in conjunction with the following drawing.

DETAILED DESCRIPTION OF THE PREFERRED EMBODIMENT

The subject invention involves utilization of an electric field to enhance the rate of vapor deposition polymerization of a film onto a substrate such as a semiconductor wafer. Briefly described, the substrate is connected to a voltage source to form one of two electrodes of a parallel plate capacitor. The capacitor is placed in a vacuum chamber where parameters such as pressure and temperature are maintained at predetermined levels. Gaseous monomers of the desired film to be polymerized, such as Parylene, Teflon or Polynapthalene are then supplied to the chamber and permitted to flow between the electrodes or plates of the capacitor. Sufficient voltage is applied to the electrodes to generate an electric field therebetween which serves to polarize the bonds of the monomers. The voltage is maintained at a level sufficiently low to nominally prevent breaking the chemical bonds of the monomers and the consequential generation of ions or free radicals. The polarized monomers polymerize on the relatively cool substrate to form the desired film at a rate substantially greater than conventional, non-field enhanced vapor deposition polymerization. For contrast purposes, a conventional VDP apparatus will now be described, with a preferred embodiment of the invention described in detail hereinafter.

Figure 1:
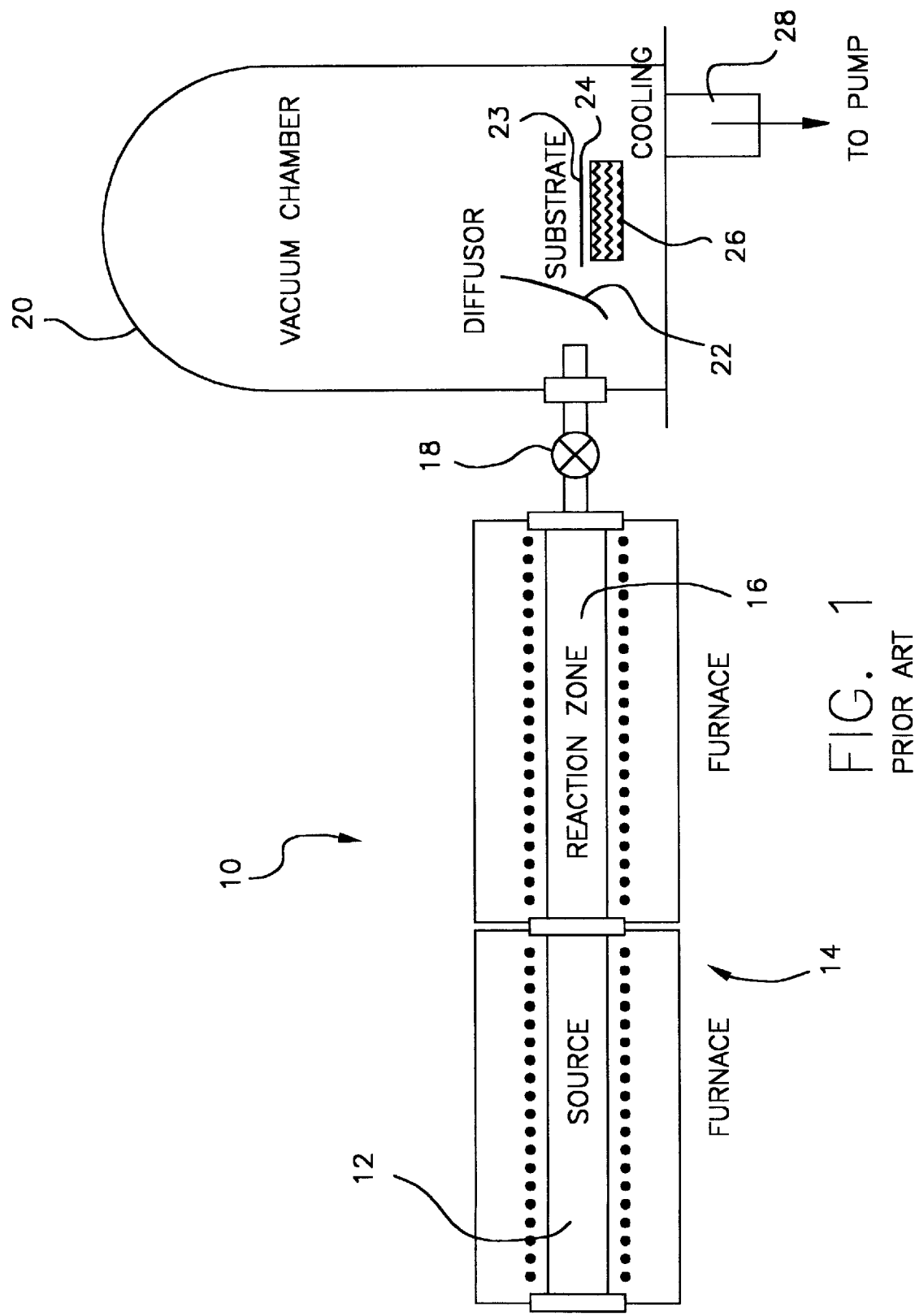
FIG. 1 is a schematic elevational view of a prior art apparatus used to deposit a polymeric film on a substrate.

Conventional vapor deposition polymerization of a PA-N film may be performed using a commonly available apparatus such as that shown in FIG. 1. In particular, the dimer is heated to approximately 150° C. in vaporizing zone 12 of furnace 14. The vapor then flows to reaction zone 16 of the furnace where it is decomposed into diradicalized monomer by pyrolysis at a temperature of approximately 650° C. The monomers are subsequently fed through a valve 18 into a vacuum chamber 20 where they are diffused by diffuser 22 and then condensed onto a generally planar surface 23 of a substrate such as a Silicon (Si) wafer 24. The wafer is maintained at a predetermined temperature (approximately 25° C.) by cooler 26. A pump (not shown) is connected to a nipple 28 of chamber 20 in a conventional manner to maintain the requisite pressure.

As discussed hereinabove, in order to obtain a polymer film of desirable quality by this conventional process, the deposition pressure is generally maintained at approximately 50 mTorr, for a deposition rate of approximately 50–70 Angstroms per minute. As also mentioned, the film quality tends to degrade at pressures above 80 mTorr.

Figure 2:
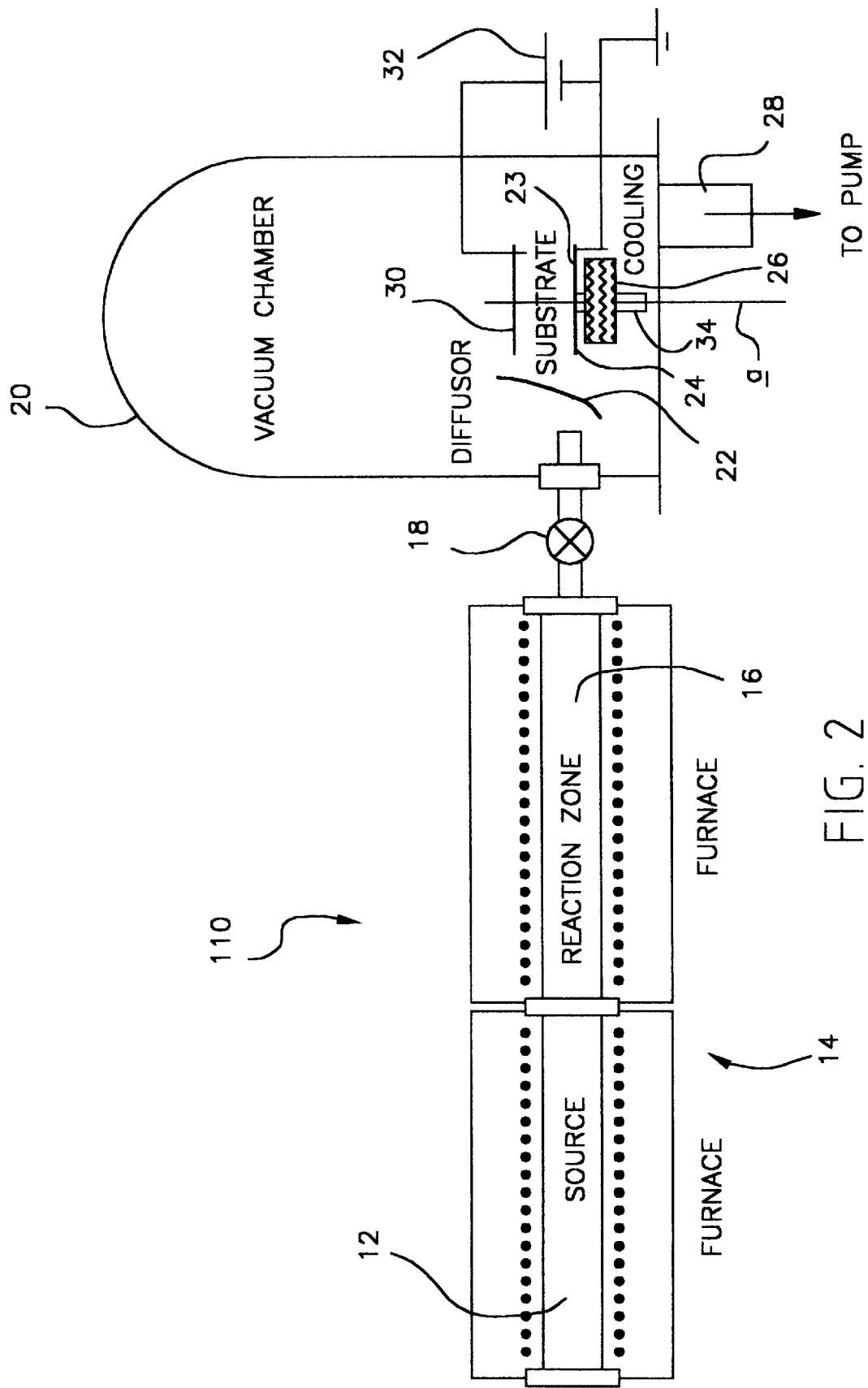
FIG. 2 is a schematic elevational view of an apparatus used to implement the subject invention.

Referring now to FIG. 2, modified apparatus 110 is similar to conventional apparatus 10 of FIG. 1, with identical components having identical reference numerals. Unlike apparatus 10 of FIG. 1, however, apparatus 110 includes a planar electrode 30 superposed in spaced relation relative to wafer 24. Electrode 30 preferably has approximately the same dimensions as the wafer such that the electrode is superposed over substantially the entire surface 23 of wafer 24. The electrode and wafer are connected in a conventional manner to respective opposite poles of a DC (direct current) voltage source 32. In this manner, the electrode, along with the wafer which acts as a second electrode, form a parallel plate capacitor configuration. In the embodiment shown, electrode 30 and wafer 24 are rigidly supported by suitable support means (not shown). However, in an alternate embodiment (also not shown), it may be possible to mount the wafer in such a way as to permit the wafer to rotate within the plane defined by surface 23. For example, the wafer may rotate about an axis a disposed orthogonally to the wafer, as shown in FIG. 2. Such rotation may serve to enhance thickness uniformity of the polymer film as will be discussed hereinafter. This rotation may be provided in any conventional manner. One possible configuration may include supporting the wafer on an end of a rotatable shaft 34 (shown in phantom) that depends orthogonally from the wafer such that rotation of the shaft about its longitudinal axis will serve to rotate the wafer in the plane of surface 23, about axis a as described hereinabove. The shaft may be driven by any conventional drive means such as a motor and pulley arrangement (not shown). In addition, the shaft is preferably constructed from an electrically conductive material. The wafer may thus be connected to voltage source 32 via a conventional brush-type electrical contact (not shown), of the type commonly used in electro-mechanical devices such as electric motors to connect a voltage source to a rotor.

Modified apparatus 110 operates in nominally the same manner as conventional apparatus 10, with the exception that the gaseous monomers pass through an electric field generated by voltage source 32 between electrode 30 and wafer 24 prior to polymerizing on surface 23 of the wafer.

Tests were performed to deposit PA-N films under the conditions set forth in the following Table 1.

TABLE 1

Deposition conditions of PA-N by electric field

| Item | Specification |
|---|---|
| substrate | 5"Si<100> |
| precursor temperature | 120–150° C. |
| reaction temperature | 650° C. |
| substrate temperature | 25° C. |
| deposition pressure | 50 mTorr |
| deposition time | 50 minutes |
| field strength | 0–600 V/cm |
| set-up configuration | parallel plate capacitor |

Figure 3:
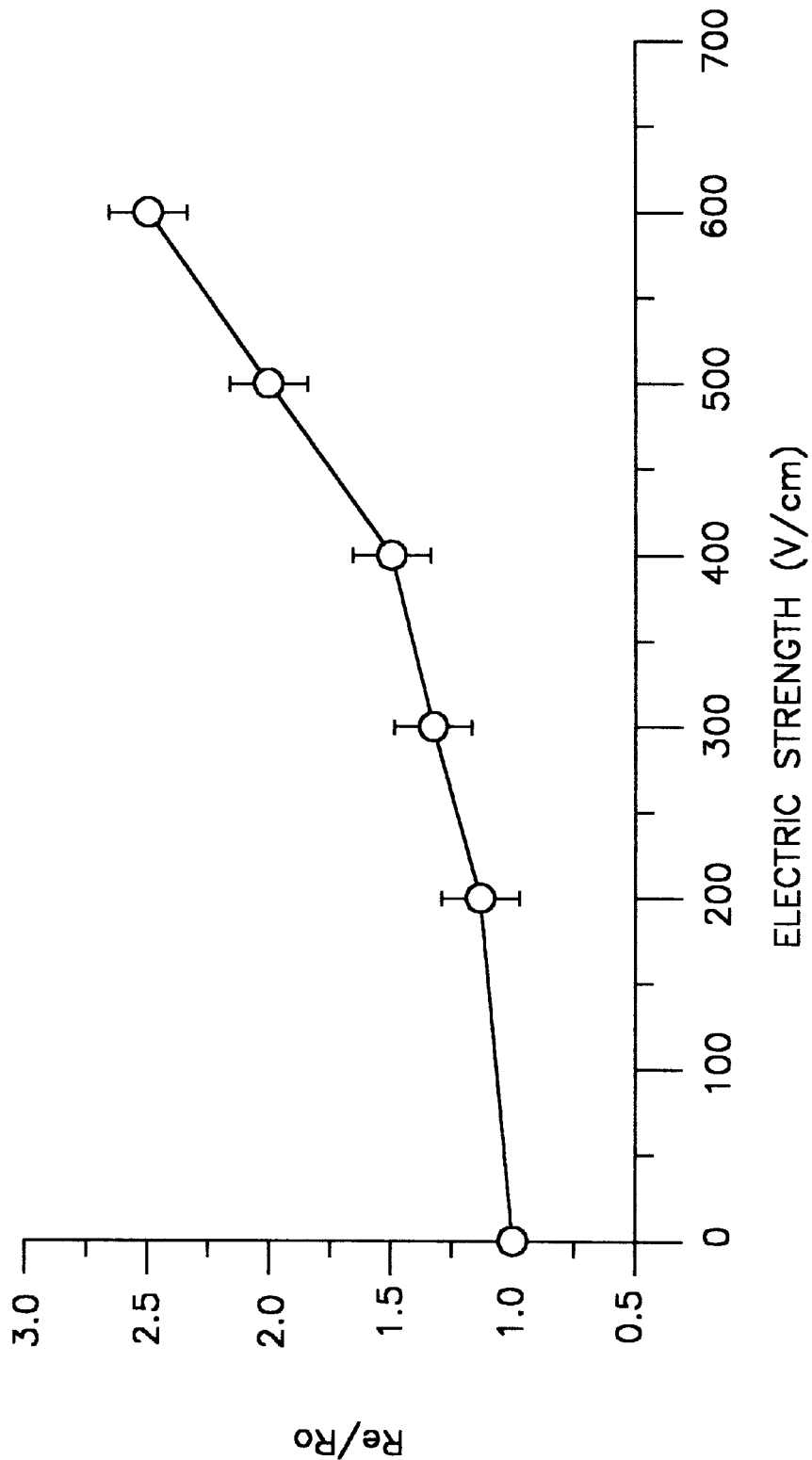
FIG. 3 is graphical representation of the increase in deposition rate of a PA-N (Parylene-N) film utilizing the subject invention, as a function of electric field strength.

Under these test conditions, the PA-N deposition rate has been observed to increase as the electric field strength increases. Indeed, referring now to FIG. 3, the ratio (Re/Ro) of deposition rate with an electric field (Re), to the deposition rate without an electric field (Ro) is shown to increase as a function of electric field strength. This ratio was determined from measurements of film thickness taken at a predetermined central area of the wafer during deposition. As shown, when the field strength is weak, i.e. 200–250 V/cm, the ratio Re/Ro is approximately 1.3–1.4. When the field strength is increased to approximately 600 V/cm, the ratio is nearly doubled.

It has been found, however, that there is an upper limit for the field strength. When the electric field strength is increased to a point above that upper limit, sparks may be generated which may in turn, cause film quality degradation. Such problems are hypothesized to be the result of generation of free radicals from the monomers and subsequent incorporation of the free radicals into the PA-N film. It has been found that for PA-N deposition at a pressure of 50 mTorr, the applied field strength is preferably maintained at or below 800 V/cm.

Figure 4:
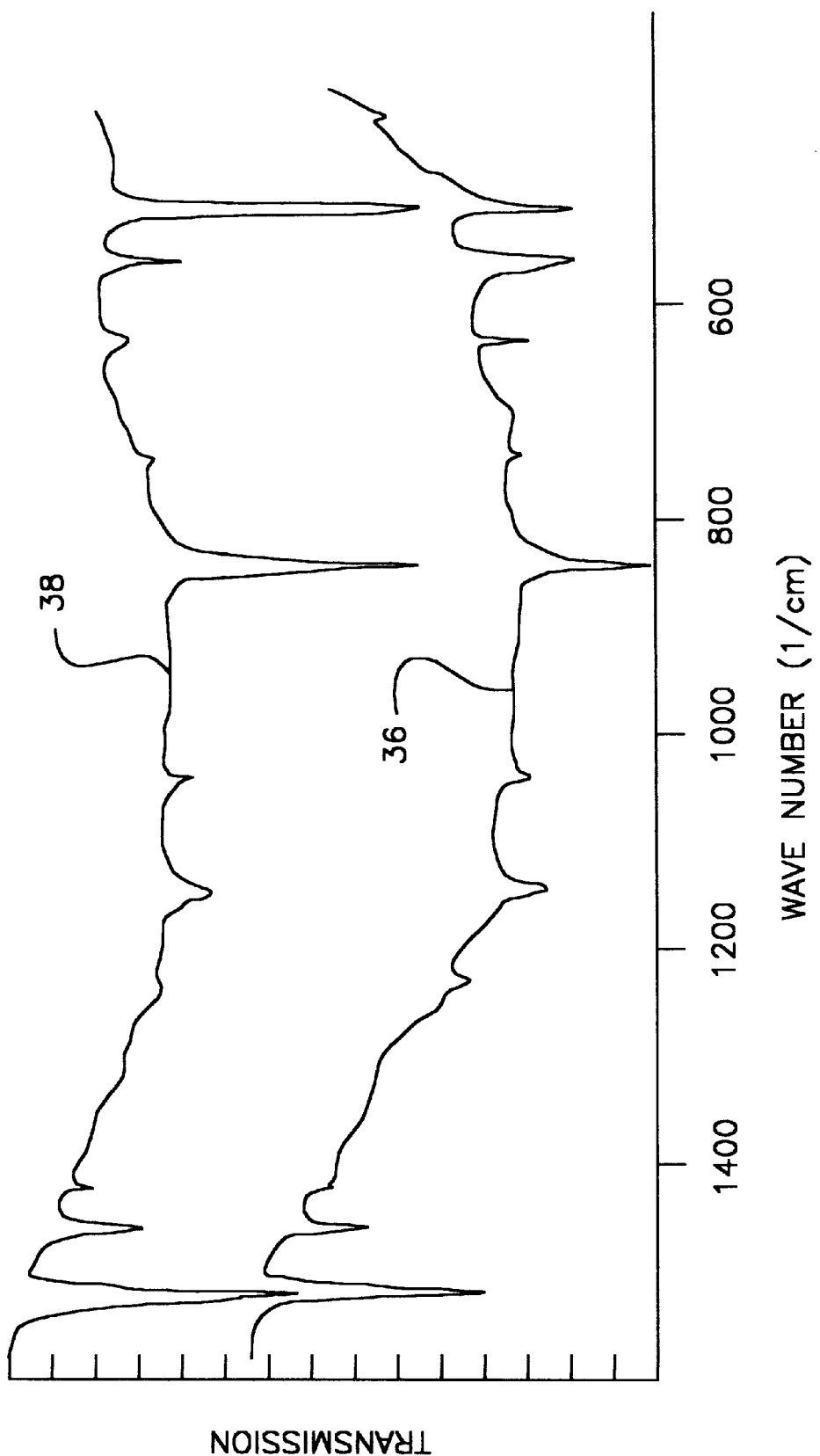
FIG. 4 is a graphical comparison of FTIR (Fourier Transform Infra-Red) spectra obtained from respective samples of PA-N film formed with and without an electric field.

Referring now to FIG. 4, there is virtually no structure change between PA-N films deposited using the present invention (with an electric field) and those deposited conventionally without an electric field. This is evidenced by the substantially identical FTIR (Fourier Transform Infra-Red) spectra 36 and 38 obtained for PA-N films obtained with and without an electric field of approximately 600 V/cm, respectively.

Figure 5:
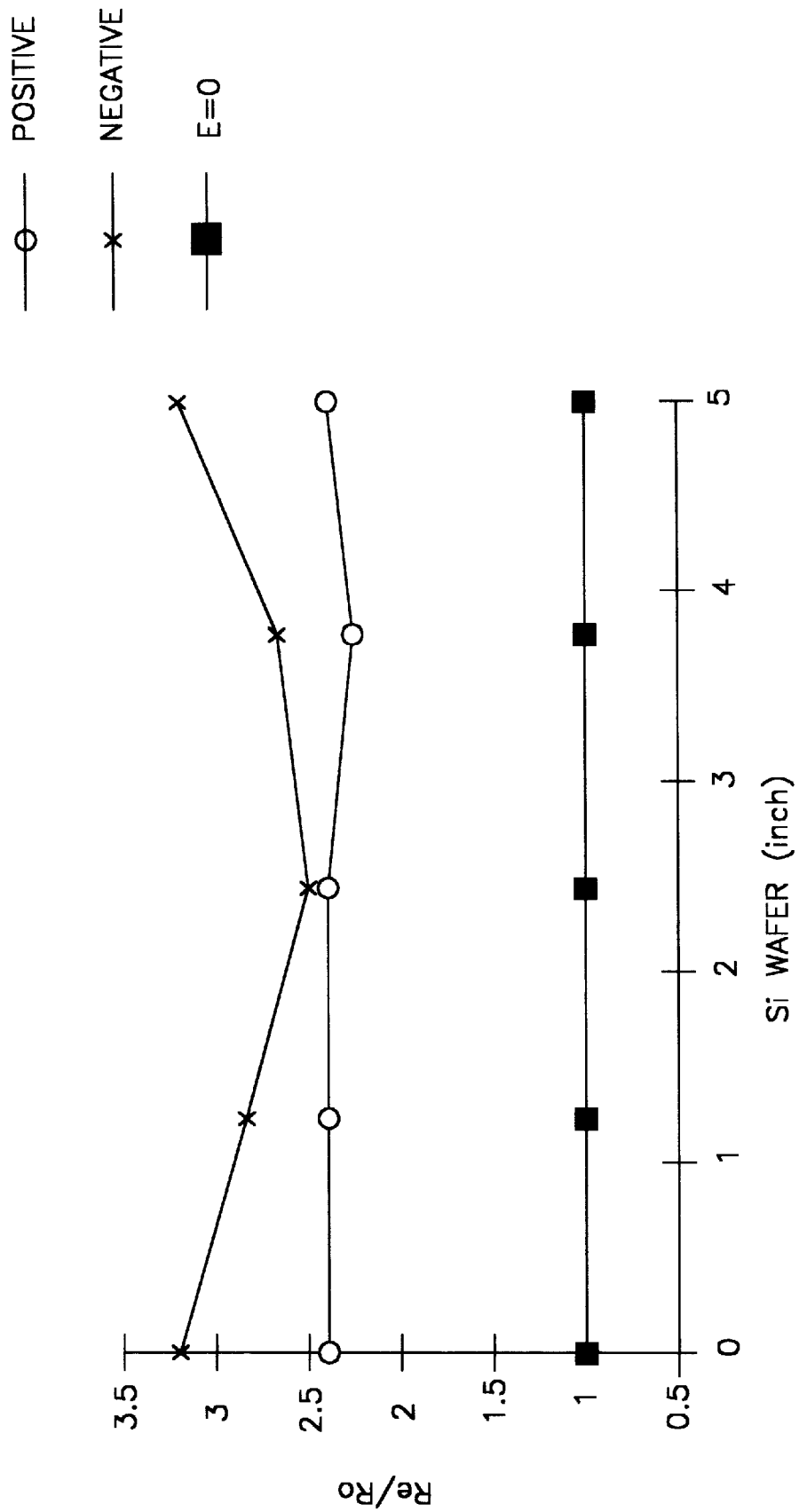
FIG. 5 is a graphical representation of thickness of films formed using the subject invention, plotted as a function of the polarity of the applied electric field.

Referring now to FIG. 5, tests were performed in which PA-N film was deposited on a wafer 24 connected to the positive terminal of voltage source 32 (positively biased wafer) and on a wafer connected to the negative terminal of voltage source 32 (negatively biased wafer). The field strength was approximately 500 V/cm. The electric field of the present invention was observed to increase the deposition rate of PA-N by 2.4 times on the positively biased wafer 24. The deposition rate on the negatively biased wafer was more than tripled while the uniformity was reduced relative to the positive polarity test. These tests were performed with stationary wafers. The observed reduction in uniformity may be at least partially ameliorated by translation and rotation, or planetary motion, of the wafer, e.g. pursuant to the alternative embodiment discussed hereinabove so that all surface portions of the wafer are equally exposed to the different deposition rate regions.

The increase in deposition rate is a result of polar interactions between normally non-polar monomers that have been polarized by the field, as will be discussed hereinafter. The increased rate of deposition on the edges relative the central portion of the wafers, particularly apparent in the negatively biased wafer, is believed to be a result of a field fringe effect, as will also be discussed hereinafter.

As mentioned hereinabove, it is believed that the electric field of the present invention serves to polarize the normally non-polar monomer molecules without breaking the bonds thereof. The field is thus strong enough to induce a dipole moment within the monomer molecules without being strong enough to break the molecular bonds and create free radicals or ions.

While it is clear that use of the field in this manner serves to increase deposition rate, the specific mechanisms or reasons responsible for the increased rate are not fully understood. Some hypotheses have however been formulated that may provide at least partial explanations.

One hypothesis in particular is that as the monomers condense on wafer 24 to form a polymer chain, the field polarizes the chain in a manner similar to the polarization of the monomers. An induced pole of each monomer may thus interact with an oppositely charged pole of the chain. Such polar interaction presumably provides additional attractive intermolecular interaction to increase the probability of reaction between the monomers and the polymer chains. This increase in monomer/polymer chain reaction may then result in an increase in rate of polymerization or film deposition.

Figure 6:
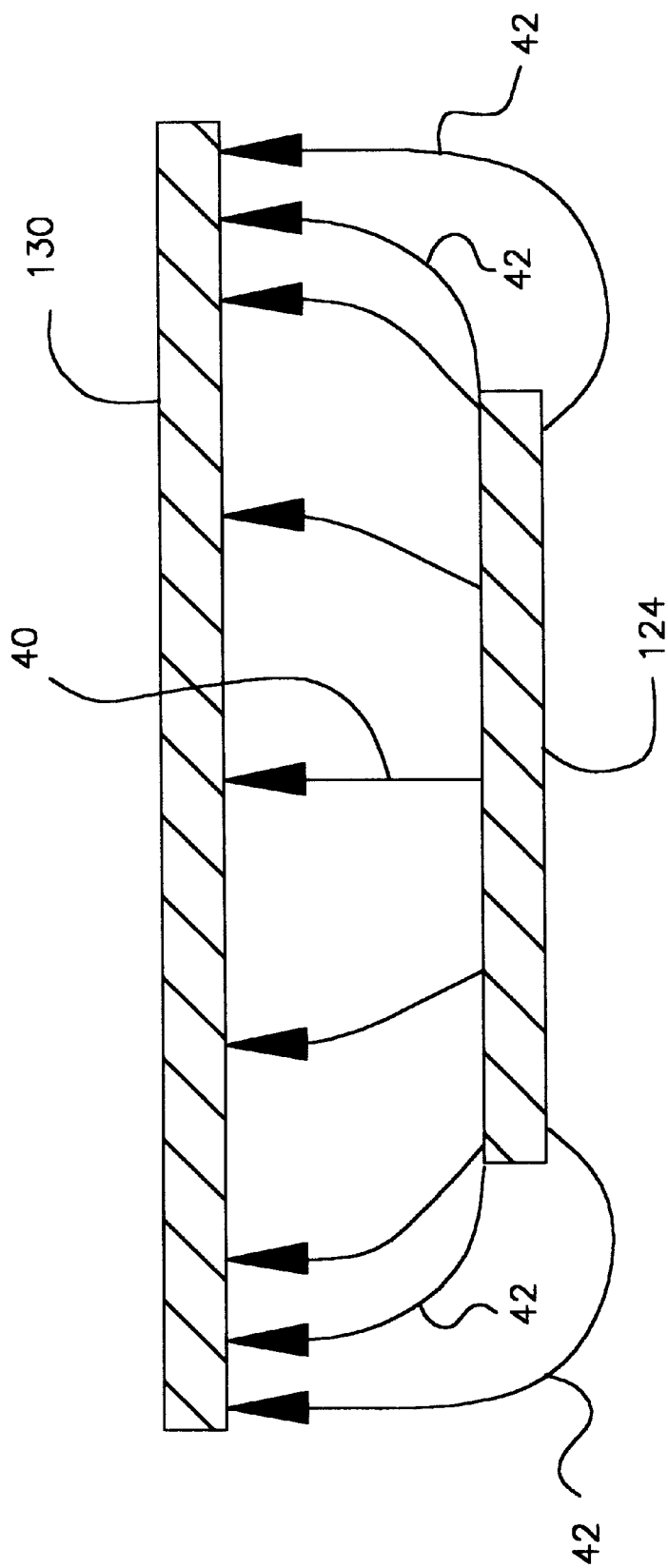
FIG. 6 is a cross-sectional schematic representation of a portion of an apparatus similar to that of FIG. 2, including generalized field lines occurring between electrodes.

Non-uniformities of the electric field may contribute to the increased rate of deposition. In particular, the field may be non-uniform on particular areas of the wafer, such as proximate the edges thereof (the aforementioned fringe effect). Field non-uniformities may result from any number of factors, including local electromagnetic interference, or specific physical characteristics of the apparatus 110, such as slight differences in the planar area of the electrode vis-a-vis the wafer. For explanatory purposes, this effect is shown in an exaggerated manner in FIG. 6, in which an electrode 130 and wafer 124 are of substantially differing size. As shown, electrode 130 is substantially larger than wafer 124. Accordingly, a field line 40, connecting the centers of both the electrode and wafer, extends generally orthogonally therebetween, as shown. However, field lines (as indicated by reference numeral 42) spaced on either side of central field line 40, tend to diverge from the orthogonal direction of field line 40. Moreover, the angle of divergence increases proportionally to the distance of each field line 42 from central field line 40. This divergence is indicative of a decease in field strength, such that, as shown, the field strength is weaker at electrode 130 than at wafer 124. Accordingly, the two ends of the induced-dipole monomer will essentially experience different electric force in the non-uniform electric field. Such a non-uniform field may thus tend to produce a net attraction in the direction of the stronger field, which, as shown, is towards wafer 124. Accordingly, the polarized monomers may be accelerated towards the wafer to thereby increase the rate of deposition of the film. This hypothesis may serve to explain the experimental results set forth in FIG. 5 and discussed hereinabove, which indicate a higher rate of deposition at the edges of the wafer than at the center. This effect appears to be additive to the polar interaction discussed hereinabove.

One skilled in the art should recognize that the above described invention is not limited to PA-N (Parylene-N) alone. Rather, any use of a field to induce a polarization of molecules prior to deposition thereof onto a substrate should be understood to be within the scope of the present invention. Examples of other polymers which may be used in conjunction with the present invention are other Parylenes, such as PA-F, Teflon, and Polynapthalene.

It should be further understood that any type of field which is sufficient to polarize the molecules prior to deposition, such as a magnetic or electro-magnetic field, may be utilized without departing from the spirit and scope of the present invention.

Further still, one skilled in the art should recognize that the subject invention may be augmented by additional vapor deposition polymerization (VDP) enhancement techniques, including but not limited to varying substrate temperature, varying monomer temperature and/or varying deposition pressure, without departing from the spirit and scope of the subject invention. There can also be ancillary benefits of the electric field enhancement beyond the increase in deposition rate such as reduction of background oxygen in the film and enhanced adhesion to certain substrates. Moreover, adjustment of electric field strength can provide a more convenient method to control deposition rate more quickly than by varying other process parameters.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

Having thus described the invention, what is claimed is:
1. A method for vapor depositing a film onto a substrate comprising:
   creating a field;
   providing a substrate in the field;
   passing at least one gaseous reactant through the field to polarize gaseous molecules of the at least one gaseous reactant;
   a providing the field with sufficient strength to polarize the gaseous molecules of the at least one gaseous reactant without breaking chemical bonds thereof or generating free radicals; and
   reacting the polarized gaseous molecules to deposit a film onto the substrate.
2. The method of claim 1, wherein the field is an electric field.
3. The method of claim 2, wherein the electric field accelerates the polarized gaseous molecules in a direction towards the substrate.
4. The method of claim 2, wherein the electric field polarizes the film to promote polar interactions between the film and the polarized gaseous molecules.
5. The method of claim 2, wherein the substrate comprises an electrode utilized to generate the electric field.
6. The method according to claim 5, wherein the electric field is generated by parallel electrodes disposed to form a capacitor.
7. The method of claim 6, wherein the at least one gaseous reactant comprises gaseous monomers.
8. The method of claim 7, wherein the gaseous monomers are selected from the group consisting of Parylene, Teflon cnd Polynapthalene.

9. The method of claim 1, wherein the field is non-uniform.

10. The method of claim 1, further comprising the step of rotating the substrate.

11. A method for vapor depositing a film onto a semiconductor substrare; the method comprising;

connecting the substrate to one terminal of a voltage source;

connecting an electrode to an other terminal of the voltage source;

disposing the electrode and the substrate in superposed orientation to form a parallel plate capacitor, wherein an electric field is produced between the electrode and the substrate;

disposing the parallel plate capacitor in a chamber where pressure and temperature are maintained at predetermined levels;

introducing gaseous monomers of a desired film to be polymerized into the chamber;

flowing the gaseous monomers between the electrode and the substrate; and providing the electric field at a level sufficient to polarize the gaseous monomers without breaking their chemical bonds or generating free radicals wherein the polarized gaseous monomers react to deposit a polymer film on the substrate at an enhanced rate compared to a rate without the field.

12. The method of claim 11, wherein the field is non-uniform.

13. The method of claim 11, further comprising the step of rotating the substrate.

* * * * *

UNITED STATES PATENT AND TRADEMARK OFFICE
CERTIFICATE OF CORRECTION

PATENT NO. : 6,022,595
DATED : February 08, 2000
INVENTOR(S) : McDonald et al.

It is certified that error appears in the above-identified patent and that said Letters Patent is hereby corrected as shown below:

ON THE TITLE PAGE:

Item [57] ABSTRACT, line 8, delete "andc" and replace with --and--.

Claim 1, Col. 6, line 44, delete "a" before "providing".

Claim 8, Col. 6, line 67, delete "cnd" and replace with --and--.

Signed and Sealed this

Fourteenth Day of November, 2000

Q. TODD DICKINSON

*Attest:*

*Attesting Officer*   *Director of Patents and Trademarks*